United States Patent
Daves et al.

[19]

[11] Patent Number: 6,091,603
[45] Date of Patent: Jul. 18, 2000

[54] CUSTOMIZABLE LID FOR IMPROVED THERMAL PERFORMANCE OF MODULES USING FLIP CHIPS

[75] Inventors: Glenn G. Daves, Beacon; David L. Edwards, Poughkeepsie, both of N.Y.

[73] Assignee: International Business Machines Corporation, Armonk, N.Y.

[21] Appl. No.: 09/409,241

[22] Filed: Sep. 30, 1999

[51] Int. Cl.[7] .................................................... H05K 7/20
[52] U.S. Cl. .......................... 361/704; 361/703; 361/705; 361/706; 361/707; 361/708; 361/709; 361/714; 361/717; 361/718; 257/706; 174/16.3; 165/80.2; 165/80.3; 165/185; 165/104.33
[58] Field of Search ........................ 361/690, 702–710, 361/713, 712, 715–719, 722, 723; 257/675, 706, 707, 718, 719, 721, 722; 174/16.3; 165/80.2, 80.3, 104.33, 185

[56] References Cited

U.S. PATENT DOCUMENTS

| | | | |
|---|---|---|---|
| 4,323,914 | 4/1982 | Berndlmaier et al. | 357/82 |
| 5,094,769 | 3/1992 | Anderson, Jr. et al. | 252/71 |
| 5,098,609 | 3/1992 | Iruvanti et al. | 252/511 |
| 5,167,851 | 12/1992 | Jamison et al. | 252/74 |
| 5,323,294 | 6/1994 | Layton et al. | 361/699 |
| 5,387,815 | 2/1995 | Nishiguchi | 257/704 |
| 5,396,403 | 3/1995 | Patel | 361/705 |
| 5,552,635 | 9/1996 | Kim et al. | 257/706 |
| 5,572,070 | 11/1996 | Ross | 257/713 |
| 5,585,671 | 12/1996 | Nagesh et al. | 257/697 |
| 5,610,442 | 3/1997 | Schneider et al. | 257/787 |
| 5,621,615 | 4/1997 | Dawson et al. | 361/704 |
| 5,642,262 | 6/1997 | Terril et al. | 361/783 |
| 5,706,579 | 1/1998 | Ross | 29/840 |
| 5,710,459 | 1/1998 | Teng et al. | 257/717 |
| 5,717,245 | 2/1998 | Pedder | 257/691 |
| 5,724,729 | 3/1998 | Sherif et al. | 29/840 |
| 5,745,344 | 4/1998 | Baska et al. | 361/705 |
| 5,757,620 | 5/1998 | Edwards et al. | 361/705 |
| 5,819,401 | 10/1998 | Johannes et al. | 29/830 |
| 5,821,161 | 10/1998 | Covell, II et al. | 438/613 |
| 5,825,087 | 10/1998 | Iruvanti et al. | 257/707 |
| 5,834,337 | 11/1998 | Unger et al. | 438/122 |
| 5,881,944 | 3/1999 | Edwards et al. | 228/56.3 |
| 5,881,945 | 3/1999 | Edwards et al. | 228/124.6 |
| 5,885,848 | 3/1999 | Kirkland et al. | 438/106 |
| 5,898,219 | 4/1999 | Barrow | 257/713 |
| 5,907,474 | 5/1999 | Dolbear | 361/705 |
| 5,956,576 | 9/1999 | Toy et al. | 438/125 |
| 5,990,418 | 11/1999 | Bivona et al. | 174/52.4 |

FOREIGN PATENT DOCUMENTS

| | | |
|---|---|---|
| 198 21 916 A1 | 3/1997 | Germany. |
| 09 199 629 | 7/1997 | Japan. |

*Primary Examiner*—Leo P. Picard
*Assistant Examiner*—Boris L. Chervinsky
*Attorney, Agent, or Firm*—Steven Capella

[57] ABSTRACT

Integrated circuit chip packaging modules and lid structures having improved heat dissipation performance are characterized by a customized lid understructure which enables a reduction in the amount of compliant thermally conductive material in the primary heat dissipation path. The lid structures and modules are made by processes wherein the lid understructure is customized for the chip(s) to be housed. The customization is achieved by the use of shims and a deformable lid understructure.

16 Claims, 7 Drawing Sheets

CUSTOMIZABLE LID FOR IMPROVED THERMAL PERFORMANCE OF MODULES USING FLIP CHIPS

BACKGROUND OF THE INVENTION

For packaging of integrated circuit chips (especially high power chips), the ability to dissipate heat effectively away from the chip and out of the packaging module is very important. The ability of the module to dissipate heat generated by the chip(s) is generally a function of the quality of the primary heat dissipation path from the chip to the external surface of the module.

In module designs such as those described in U.S. Pat. No. 5,396,403, thermal paste or some other thermally conductive compliant material is used at a point in the primary heat dissipation path from the chip to the external surface of the module. Interfaces (where heat has to cross from one material to another) are generally the weakest link in the heat dissipation path (i.e., they have significantly lower thermal conductivity than other components of the heat dissipation path), even when they are filled with thermally conductive compliant materials.

Some of the advantages of module designs utilizing thermally conductive compliant materials are that the materials have the ability to accommodate statistical variations in thickness of chips to be housed in the module, height of the solder connections (in the case of flip chips packaging), lid cavity depth, thickness of the seal, substrate camber, etc. The ability to control variations in the various component dimensions is difficult, especially where the components may come from different manufacturers or where reworking or modification of components may be required. This problem is especially apparent where large scale commercial production is involved (i.e., a high throughput of modules).

Thus, there is a desire to further improve the thermal performance of electronic package modules in an economical way.

SUMMARY OF THE INVENTION

The invention provides lid structures and packaging modules having improved heat dissipation performance. The lid structures and modules of the invention are characterized by a customized lid understructure which enables a reduction in the amount of thermally conductive compliant (non-rigid) material in the primary heat dissipation path. The invention also encompasses methods for making the lid structures and modules of the invention wherein the lid understructure is customized for the chip(s) to be housed. The methods of the invention enable the reduction of the amount of low thermal conductivity material in the primary heat dissipation path (from the chip through the lid in modules).

In one aspect, the invention encompasses a lid structure for an electronic module containing an integrated circuit chip, the lid structure comprising:
 (a) a lid member adapted to be sealed to the module,
 (b) a primary heat dissipation path from a chip contained in the module to the lid member, the heat dissipation path comprising:
  (i) a solid customized understructure extending from the lid member toward a chip contained in the module, and
  (ii) a thermally conductive compliant material between the customized understructure and the chip.

In another aspect, the invention encompasses an electronic module housing one or more integrated circuit chips, the module comprising:

(a) a substrate,
 (b) an integrated circuit chip mounted on the substrate,
 (c) a lid member adapted to be sealed to the substrate, the lid and the substrate defining a space for containing the integrated circuit chip, and
 (d) a primary heat dissipation path from the chip contained in the space to the lid member, the heat dissipation path comprising:
  (i) a solid customized understructure extending from the lid member toward a chip contained in the module, and
  (ii) a thermally conductive compliant material between the customized understructure and the chip.

The customized understructure preferably comprises a material selected from the group consisting of solder, thermally conductive thermosetting resin, thermally conductive thermoplastic resin or other material which can be easily deformed at a temperature compatible with the integrity of the module components and chip(s), but not undergoing substantial plastic deformation in the operating temperature range of the module or the temperature at which the lid structure is to be sealed to the chip-carrying substrate. The thermally conductive compliant material is preferably compliant in the operating temperature range and sealing temperature range of the module.

The lid structures and modules may further contain one or more heat spreader members in the primary heat dissipation path. If desired, the lid structures and modules of the invention may be adapted for housing a plurality of chips.

In another aspect, the invention encompasses a method of making an electronic module for containing at least one integrated circuit chip, the method comprising:
 (a) providing a substrate having an integrated circuit chip mounted thereon,
 (b) providing a lid structure adapted to be sealed to the substrate,
 (c) providing a shim and a customizable understructure material, the customizable understructure material being positioned between the shim and the lid member and the shim being positioned between the customizable understructure material and the chip,
 (d) moving the lid member toward the substrate, whereby the customizable understructure material is deformed,
 (e) allowing the deformed understructure material to become substantially rigid, the deformed understructure material being adhered to the lid member,
 (f) moving the lid member and deformed understructure away from the substrate,
 (g) removing the shim from between the deformed understructure and the chip,
 (h) applying thermally conductive, compliant material between the chip and the deformed understructure,
 (i) sealing the lid member to the substrate to provide a primary heat dissipation path from the chip through the thermally conductive, compliant material and the deformed understructure to the lid member.

The customizable understructure preferably comprises a material selected from the group consisting of solder, thermally conductive thermosetting resin, thermally conductive thermoplastic resin or other material which can be easily deformed at a temperature compatible with the integrity of the module components and chip(s), but not undergoing substantial plastic deformation in the operating temperature range of the module or the temperature at which the lid structure is to be sealed to the chip-carrying substrate. The thermally conductive compliant material is preferably compliant in the operating temperature range and sealing temperature range of the module.

Where the customizable understructure is thermoplastic or a solder material, the methods of the invention preferably comprise heating the customizable understructure to facilitate the deformation in step (d). In such case, step (e) would comprise cooling (letting cool) the customized material. Where the customizable understructure is thermosetting, then step (d) may be performed at a temperature where the thermosetting material either does not cure or cures at a slow enough rate to allow the desired deformation to take place. In such case, step (e) may comprise elevating the temperature of the deformed thermosetting material to cause or accelerate curing.

If desired, a removable shim may be provided at the periphery of lid member in step (c) to provide a preset spacing for a desired sealing configuration or to allow use of a thicker shim between the customizable understructure and the chip without increasing the effective gap for the compliant material. Also, a heat spreader member may be provided in step (c) between the shim and the deformable understructure component whereby the spreader remains in the primary thermal dissipation path between the chip and the lid member.

In an alternative embodiment, step (c) comprises placing a shim only about the periphery of the lid member where a thick sealing member (i.e., a seal ring or other thick section sealing means is used) in step (i). The gap for compliant material would then be defined by the differential thickness of the shim compared to the sealing member. In a further alternative method, the use of shims may be avoided in the customization if the seal thickness and the compliant material gap are to be equal.

These and other aspects of the invention are described in further detail below.

DETAILED DESCRIPTION OF THE INVENTION

The invention provides lid structures and packaging modules having improved heat dissipation performance. The lid structures and modules of the invention are characterized by a customized lid understructure which enables a reduction in the amount of thermally conductive compliant material (low thermal conductivity compared to other path components) in the primary heat dissipation path. The methods for making the lid structures and modules of the invention are characterized by customizing of a lid understructure for the actual chip(s) to be housed. The methods of the invention enable reduction of the amount of low thermal conductivity material in the primary heat dissipation path (from the chip through the lid in modules).

Referring to the drawings, the lid structures 100 of the invention are preferably characterized by a principal lid member 101 which partially defines an area to be enclosed. The lid member is preferably a high thermal conductivity material (e.g., at least about 150 W/m—°K), more preferably the lid member is made of metal, metal alloy, ceramic, or a composite. Aluminum is a preferred metal. Examples of other possible materials include copper, AlSiC, AlN, SiC, and WCu. If desired, the lid structure may be plated with a material such as Ni, Cr, CrNiAu or other materials adapted to improve one or more properties such as corrosion resistance, adhesion, solder wetting, etc.

In some instances, the lid structure 100 may have a peripheral annular extended portion 102 which participates in sealing of the lid structure to a substrate and/or in defining the chip-containing enclosure. If desired, the peripheral portion of lid member 101 may contain other features (e.g., in an overhanging lid edge—not shown) such as holes, grooves, etc. for participation in the mechanism of sealing lid structure 100 to a chip-carrying substrate 500. The lid structure is preferably an integral structure, however, in some instances, the lid structure 100 may be formed from discrete components suitably joined together (e.g., principal lid member 101 may be joined to annular extension 102 as opposed to being an integral structure). The lid structure 100 may also have studs or other features (not shown) extending outward to facilitate attachment of a heat sink.

Figure 3A:
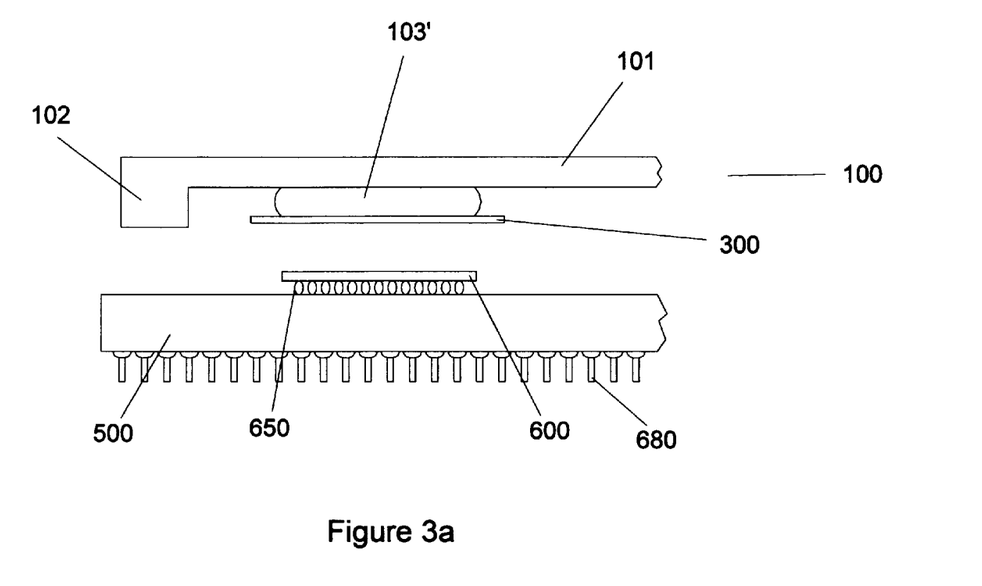
FIG. 3a is a schematic cross section view of the lid structure and chip-containing substrate of FIG. 1 just prior to understructure customization.
Figure 3B:
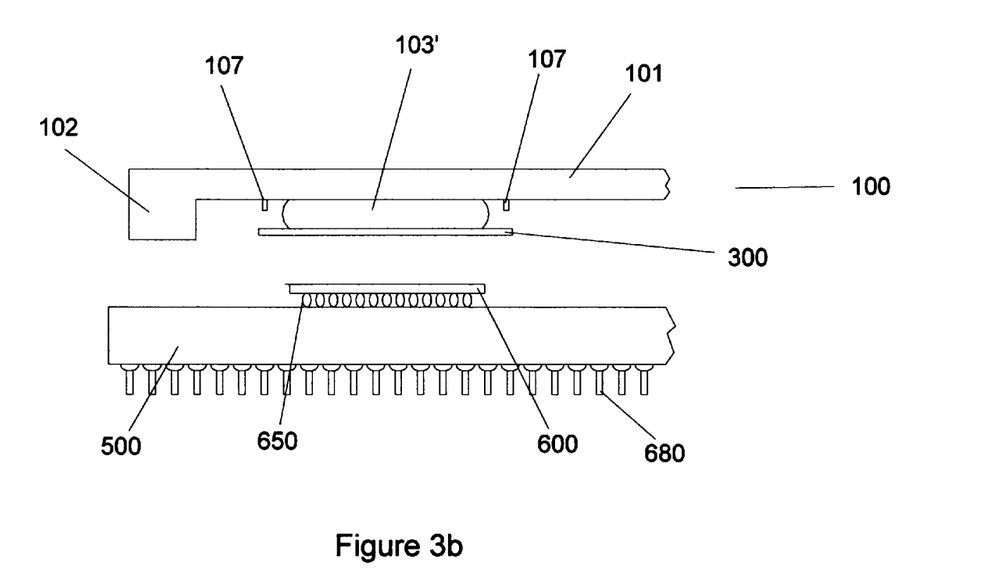
FIG. 3b is an alternative embodiment of FIG. 3a showing the presence of a dam feature.
Figure 4A:
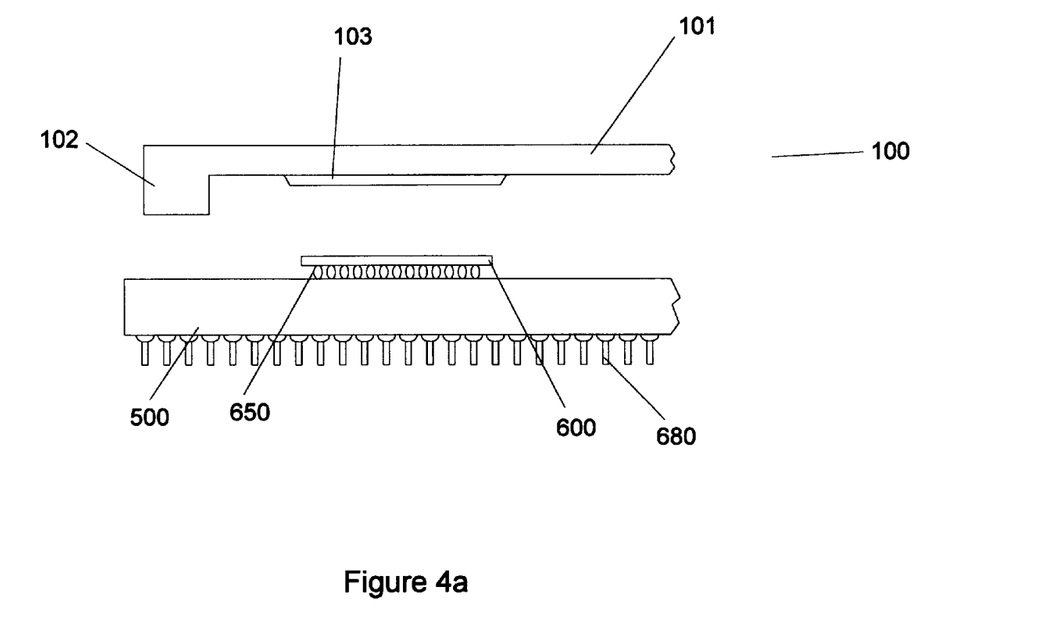
FIG. 4a is a schematic cross section view of the lid structure and chip-containing substrate of FIG. 3a after understructure customization and shim removal.
Figure 4B:
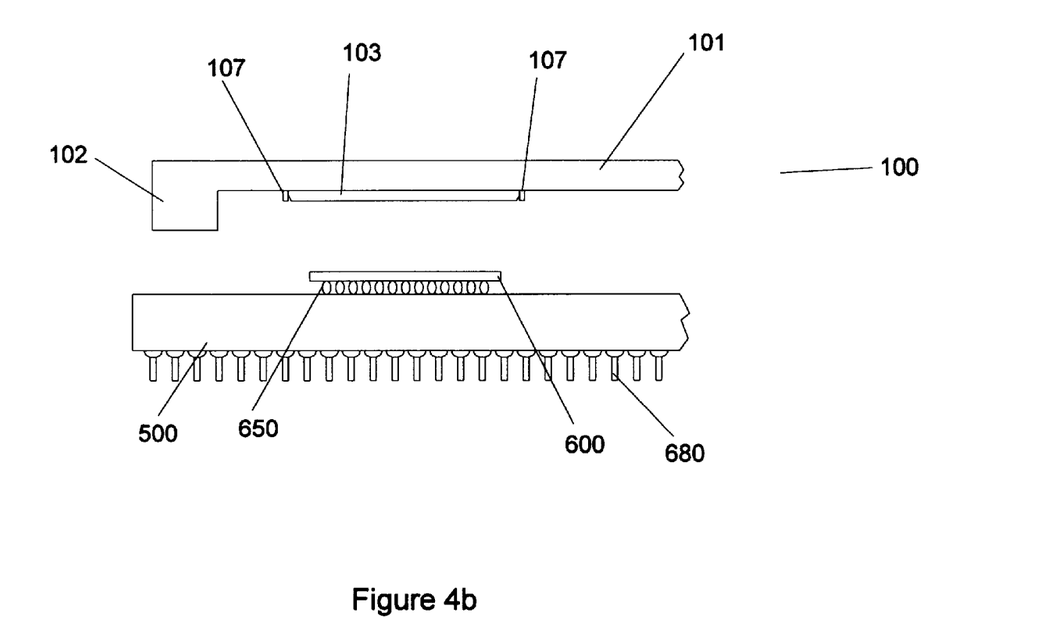
FIG. 4b is a schematic cross section view of the lid structure and chip-containing substrate of FIG. 3b after understructure customization and shim removal.
Figure 5:
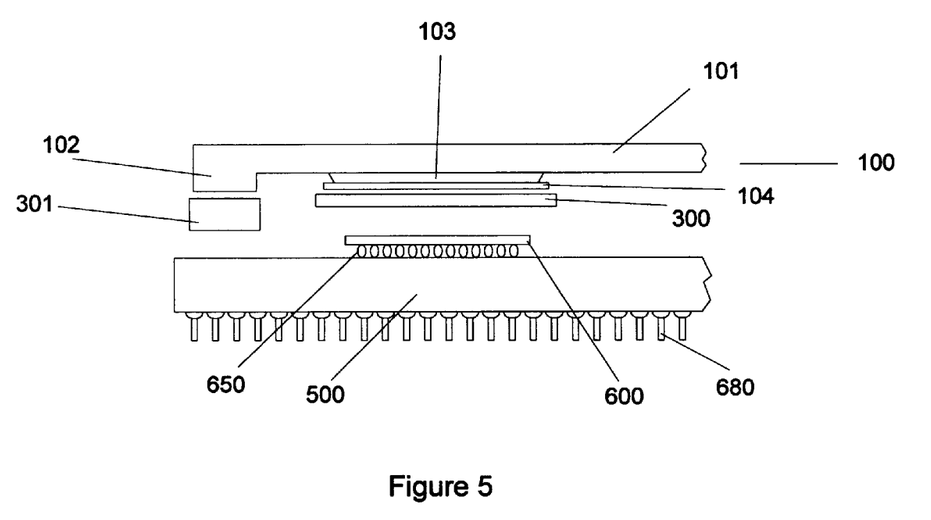
FIG. 5 is a schematic cross section view of the lid structure and chip-containing substrate after customization of the understructure using shims at the understructure and seal ring locations.
Figure 6:
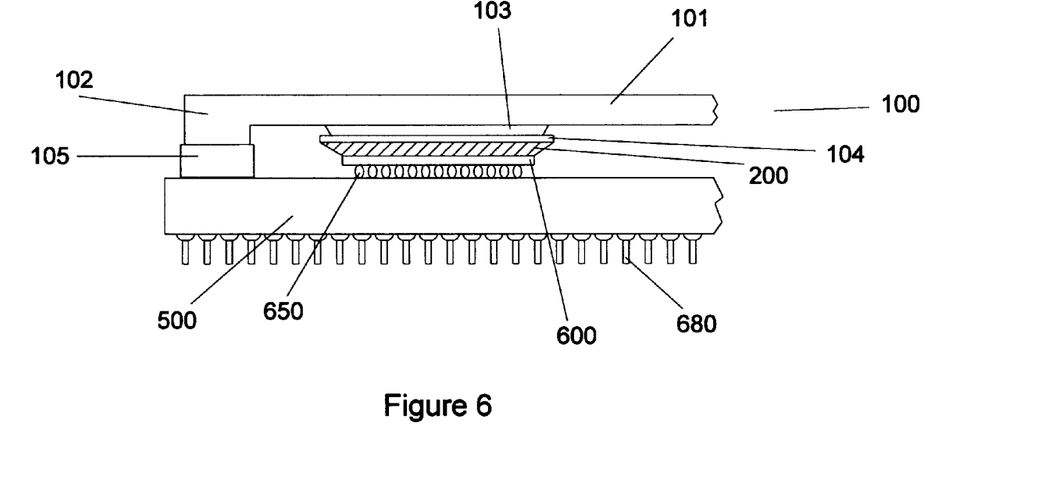
FIG. 6 is a schematic cross section view of an electronic module formed by sealing the lid structure and chip-containing substrate of FIG. 5 after shim removal and application of thermal paste.

The attachment of the customizable understructure 103 to the lid member 101 may be aided by features incorporated into lid member 101. Such features will vary depending on the material choices made for the lid and understructure. Examples of such features include selective metallization (not shown—accomplished by various means including plating and sputtering) of the lid cavity intended either to enhance and/or inhibit the wetting of the customizable understructure (especially useful if solder is the understructure material). If desired, the lid structure 100 may also have rigid understructure features 107 (in FIGS. 3b and 4b) adapted to control the position of the customizable understructure 103. Also envisioned are features which would serve to collect or pool displaced understructure material, such as machined or molded channels and/or cavities in the lid member.

Figure 1:
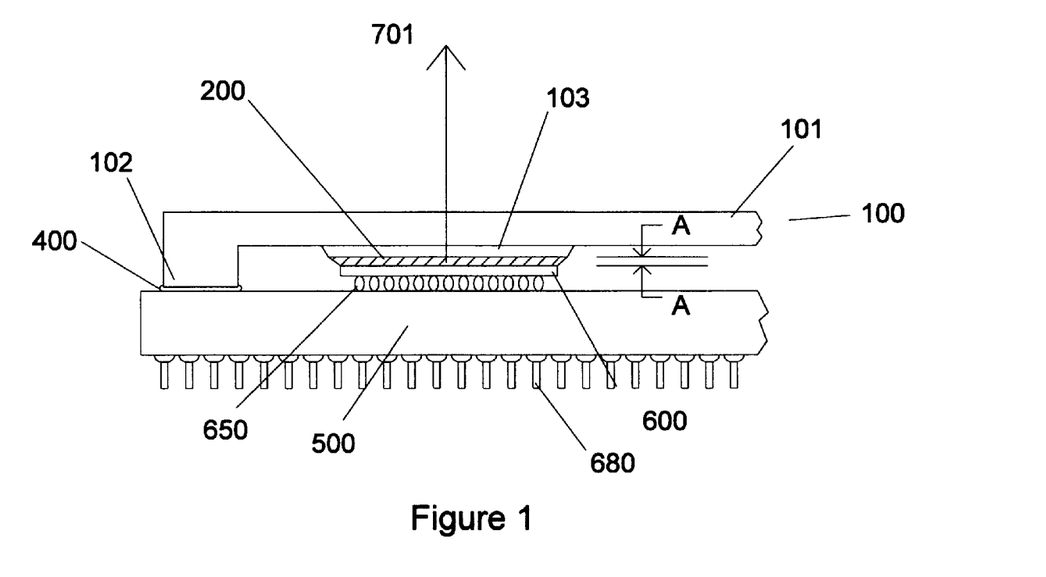
FIG. 1 is a schematic cross section view of a module of the invention including a customized lid structure and chip-containing substrate with no heat spreader in the primary thermal path.
Figure 2:
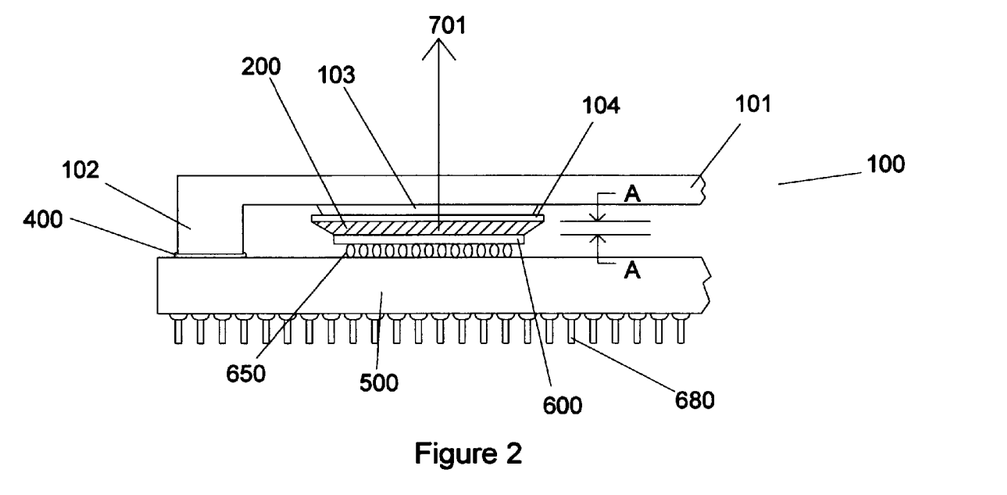
FIG. 2 is a schematic cross section view of a module of the invention including a customized lid structure and chip-containing substrate with a heat spreader in the primary thermal path.
Figure 7:
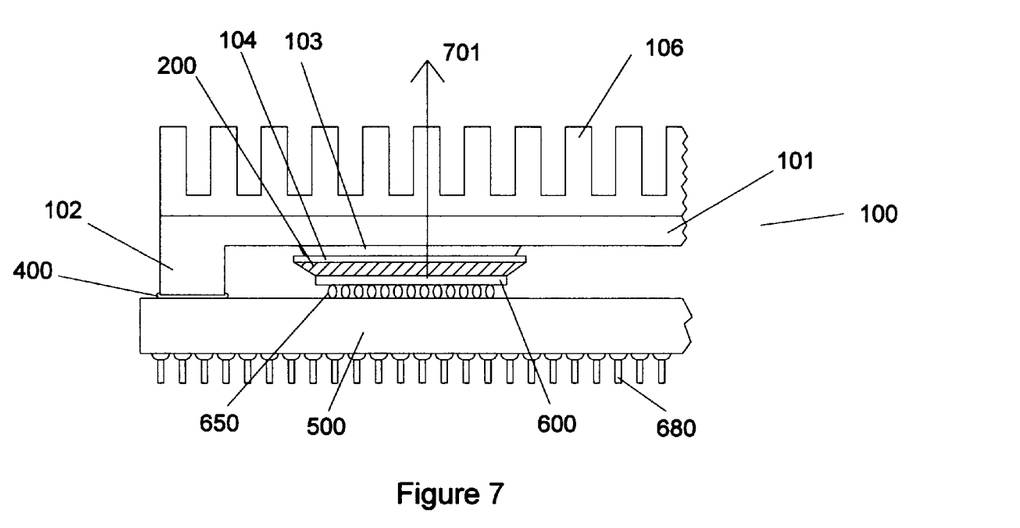
FIG. 7 is a schematic cross section view of the module of FIG. 2 showing an attached heat sink.

The lid structures 100 of the invention are further characterized by the presence of a customized understructure 103 extending from the lid member 101, which understructure 103 forms part of the primary heat dissipation path 701 for one or more integrated circuit chips 600 to be housed under the lid structure of the invention. If desired, the lid structure 100 may have a plurality (not shown) of customized understructures 103 to provide each of a plurality of chips with a separate primary heat dissipation path through lid member 101. The customized understructure 103 is preferably directly bonded to lid member 101. If desired, additional rigid, thermally conductive components (not shown) may be present in the thermal path 701 (shown in FIGS. 1, 2, and 7) between customized understructure 103 and lid member 101.

Understructure 103 preferably comprises a material selected from the group consisting of solder (e.g., 63/37 Sn-Pb solder, Sn-Bi, Sn-In, etc.), thermally conductive thermosetting resin (e.g., an epoxy resin), thermally conductive thermoplastic resin or other material which can be easily deformed at a temperature compatible with the integrity of the module components (especially solder bumps/columns used to mount and connect chip(s) to the substrate) and chip(s), but not undergoing substantial plastic deformation in the operating temperature range of the module or the temperature at which the lid structure is to be sealed to the chip-carrying substrate. In the case of a thermosetting resin, the resin should be curable in the temperature range described above. If desired, a room temperature curable resin may be used as long as it can maintain a sufficiently soft state during customization. In general, solder is a preferred material. If a resin is used, preferably a higher thermal conductivity resin or filled resin is selected.

The primary thermal path 701 from chip 600 is further characterized by the presence of a thermally conductive, compliant material 200 between the chip 600 and the customized understructure 103. The modules of the invention are preferably characterized by a reduced section thickness measured in the principal direction of the primary thermal path 701 (A in FIGS. 1 and 2) occupied by the thermally conductive, compliant material 200. The thermally conductive, compliant material 200 is preferably positioned in direct contact with the chip(s) 600 to be contained in the module. The thickness (A) is preferably less than about 12 mils (~300 µm), more preferably about 3–10 mils (~75–250 µm), most preferably about 4–6 mils (~100–150 µm). The thermally conductive compliant material is preferably a thermally conductive paste, grease or compliant material such as those described in U.S. Pat. Nos. 5,094,769; 5,098,609; or 5,167,851, the disclosures of which are incorporated herein by reference.

The thermal path 701 may also contain additional thermally conductive structural elements such as a heat spreader 104 (shown in FIGS. 2, 5, 6, & 7) to further improve thermal performance of the module. The spreader 104 may also facilitate manufacture of the module by acting as a barrier between the customizable component 103' and the shim 300 during customization (see FIG. 3). The spreader 104 would prevent any unwanted adhesion between the shim 300 and the customizable material 103'. Adhesion between the spreader 104 and the understructure 103 is generally desirable, but not absolutely necessary. The spreader 104 is preferably considerably wider than the dimensions of the chip as long as it doesn't undesirably interfere with positions of other components in the module.

The spreader 104 may be formed from any material that is suitably thermally conductive and capable of being suitably rigid under the manufacturing and expected use conditions. Where the spreader 104 is bonded to the customized understructure 103, preferably, the materials have sufficient thermal expansion compatibility with each other and with the principal lid member 101 to avoid generation of undesired stresses and strains (e.g., on exposure to thermal cycling conditions). Preferred heat spreader materials are Cu, Al, AlSiC, SiC, WCu, AlN, diamond and other high thermal conductivity materials.

The invention is not limited to any specific substrate or chip configuration. The substrate 500 to which the chip(s) 600 and lid structure 100 are attached may be any conventional substrate design. Preferably, the substrate is suitable for housing the chip(s) in a flip chip configuration as shown in the Figures. The chip(s) is preferably electrically connected to an external environment through metallization (not shown) configured in the substrate. In accordance with a flip chip arrangement, the electrical connection of the chip(s) to the substrate is preferably made through solder bumps or solder columns 650. The solder bumps or columns 650 typically support the chip on the substrate, mechanically fasten the chip to the substrate, and electrically connect the chip to metallization in the substrate.

The substrate is preferably a conventional ceramic substrate (e.g., glass ceramic, alumina or aluminum nitride). Alternatively, materials such as silicon or organic resin laminates may also be used.

The peripheral region of the substrate (external to the location of the chip(s)) may include features (not shown) used in sealing the lid structure to the substrate. For example, there may be through holes to engage a fastening means such as a bolt. Alternatively, the periphery of the substrate may have metallization (not shown) adapted to facilitate joining of the substrate directly to the lid structure or to a seal ring 105 (FIG. 6) which in turn is fastened or fixed to the lid structure. It should be understood that the invention is not limited to any specific sealing configuration. Preferably, sealing is performed using sealing material 400 (FIG. 1) such as a resin (e.g., epoxy or silicone) or solder or a mechanical seal. A silicone seal is most preferred. Preferably, the sealing configuration is capable of maintaining at least a bubble leak tight seal. If desired, a hermetic seal may be formed using techniques known in the art (e.g., a solder seal).

The module of the invention preferably further comprises a heat sink structure 106 (FIG. 7) either attached to or integral with the lid member 101. Any conventional heat sink structure may be used. Attachment of the heat sink may be performed using bolts, adhesive, clips or other means known in the art.

The modules of the invention may be configured to carry a single chip or a plurality of chips as desired. The invention advantageously provides a narrow thermal paste (compliant thermally conductive material) section even when a plurality of chips are housed in the same module. Preferably, each chip has its own customized understructure. In some instances, it may be possible for two or more chips to use a common customized understructure.

The modules and lid structures of the invention are preferably manufactured by methods involving the use of a shim(s) 300 (FIGS. 3a, 3b, & 5) to customize the customizable material 103' attached to the lid member 101. The use of the shim 300 enables the setting of the thermal paste gap or section thickness (measured in the principal direction of the primary thermal path 701) to a very high precision even in the face of significant variances in chip thickness (on a chip-to-chip basis), lid cavity depth, solder bump height, etc.

The methods of the manufacturing the lid structures and modules of the invention preferably involve:

(a) providing a substrate 500 having an integrated circuit chip(s) 600 mounted thereon, (b) providing a lid structure 100 adapted to be sealed to the substrate 500, said lid structure 100 comprising a principal lid member 101, (c) providing a shim 300 and a customizable understructure material 103', the customizable understructure material 103' being positioned between shim 300 and lid member 101 and shim 300 being positioned between customizable understructure material 103' and chip 600, (d) moving lid member 101 toward substrate 500, whereby the customizable understructure material 103' is deformed, (e) allowing the deformed understructure material 103 to become substantially rigid, the deformed understructure material 103 preferably being adhered to lid member 101, (f) moving the lid member 101 and deformed understructure 103 away from the substrate 500, (g) removing shim 300 from between deformed understructure 103 and chip 600, (h) applying thermally conductive, compliant material 200 between chip 600 and deformed understructure 103, (i) sealing lid structure 100 to substrate 500 (e.g., using sealant 400) to provide a primary heat dissipation path 701 from chip 600 through thermally conductive, compliant material 200 and deformed understructure 103 to lid member 101.

The substrate 500 with mounted chip(s) 600 provided in step (a) may be any conventional configuration formed by techniques known in the art. Preferably, the substrate is a ceramic substrate, and the chip(s) 600 is mounted in a flip chip configuration on solder bumps or columns 650. The substrate may also have other attached passive elements (not shown) such as capacitors, resistors, thermistors, etc. The substrate would also typically have various metallization patterns running through it to allow electrical connection from the chip-side of the substrate to the underside I/O connections 680 of the substrate.

The lid structure 100 provided in step (b) may be any of the type discussed above in regard to the lid structure and module. The lid member 101 is preferably a substantially planar rigid structure. The lid structure provided in step (b) is preferably one such as described above in connection with the lid structures and modules of the invention. The lid structure 100 may have peripheral features such as an annular extension 102 to participate in the sealing of the lid structure 100 to substrate 500. The lid structure 100 may be provided with a heat sink structure 106 (FIG. 7) on its top side. Alternatively, a heat sink structure 106 may be attached to the top side of the lid member 101 at a later point in the manufacturing process is desired.

The shim 300 provided in step (c) may be any material that is suitably planar and capable of being formed in precise thin sections (e.g., a 5 mil (125 $\mu$m) thickness). Preferred shim materials are metals such as aluminum, copper, stainless steel or rigid organics such as polycarbonate (such as LEXAN sold by General Electric Plastics), polyimide (such as KAPTON sold by E. I. DuPont de Nemours Company). Where the shim and customizable understructure material are in direct contact during the subsequent customization step, the shim is preferably relatively non-reactive with the customizable understructure material under the customization conditions such that the shim can be easily removed after the customization. The shim thickness is preferably the minimum thickness needed to ensure reliable assembly and operation of the module (e.g., taking into account the desired seal thickness, etc.).

The customizable understructure material 103' may be pre-attached to the underside of the lid member 101 or the customizable understructure material 103' may be provided as a separate component that is stacked between the shim 300 and the underside of the lid member 101. If a heat spreader 104 is employed, it is preferably inserted between the shim 300 and the customizable understructure material 103' in step (c). If a heat spreader is used, the customizable understructure material may be pre-attached to the heat spreader which in turn is stacked between the shim 300 and the underside of the lid member 101. If desired, a removable shim 301 (FIG. 5) may be provided at the periphery of lid member in step (c) to provide a preset spacing for a desired sealing configuration or to permit the use of a thicker (more easily handled) shim 300.

The customizable understructure material 103' provided in step (c) preferably comprises a material selected from the group consisting of solder, thermally conductive thermosetting resin, thermally conductive thermoplastic resin or other material which can be easily deformed at a temperature compatible with the integrity of the module components and chip(s), but not undergoing substantial plastic deformation in the operating temperature range of the module or the temperature at which the lid structure is to be sealed to the chip-carrying substrate.

Once the desired stack is assembled in step (c), the customizable understructure material is deformed by moving lid member 101 toward substrate 500 in step (d). In some instances, depending on the flowability of the customizable understructure material and the weight of the lid member, the force of gravity may be sufficient. Alternatively, clamping, pressing or other techniques may be used to provide the necessary force. Where the customizable understructure 103' is thermoplastic or a solder material, step (d) preferably comprises heating the customizable understructure to facilitate the deformation in step (d). Where the customizable understructure 103' is thermosetting, then step (d) may be performed at a temperature where the thermosetting material either does not cure or cures at a slow enough rate to allow the desired deformation to take place.

Where the customizable material 103' is thermoplastic or solder, step (e) would comprise cooling (letting cool) the customized material 103 to set the material in the customized dimension. Where the customizable material 103' is thermosetting, step (e) may comprise elevating the temperature of the deformed thermosetting material to cause or accelerate curing of the customized material 103 to set the material in the customized dimension.

Once the customized understructure has solidified sufficiently, the lid structure including the customized understructure 103 is moved away from the substrate 500 to allow the shim(s) 300 (and 301, if present) to be removed.

With the customized lid structure achieved, the module may be assembled by applying the thermally conductive, compliant material 200 over chip 600 (and/or on the underside of the customized understructure 103 or heat spreader 104, if used). The lid structure 100 and substrate 500 with mounted chip(s) 600 are then reassembled and sealed using desired sealing means about the periphery of lid protrusion 102. The invention is not limited to any specific sealing method, for example, sealing may be achieved using solder, silcone adhesive, or epoxy or other bonding material and/or mechanical fastening.

Where multiple chips are contained in the package, the customization step is preferably performed simultaneously for all chips using a common shim or different shims for each chip.

In an alternative embodiment (not shown), step (c) comprises placing a shim only about the periphery of the lid member where a thick sealing member (i.e., a seal ring or other thick section sealing means is used) in step (i). The gap for compliant material would then be defined by the differential thickness of the shim compared to the sealing member. The portions of the method calling for placement or removal of the shim would refer to the shim 301. This embodiment preferably involves use of a spreader 104 between the customizable material 103' and the chip 600 to prevent any undesired adhesion between chip 600 and the customizable material 103' during customization (e.g., such as might prevent separation to remove shim 301 after customization). In a further alternative method, the use of shims may be avoided in the customization if the seal thickness and the compliant material gap are to be equal.

What is claimed is:

1. A lid structure for a module containing at least one integrated circuit chip, said lid structure comprising
   (a) a lid member adapted to be sealed to said module,
   (b) a primary heat dissipation path from said chip(s) contained in said module to said lid member, said heat dissipation path comprising:
      (i) a solid customized understructure extending from said lid member toward said chip contained in said module, and
      (ii) a thermally conductive, compliant material between said customized understructure and said chip.

2. The lid structure of claim 1 wherein said heat dissipation path further comprises a rigid thermally conductive spacer between said solid customized understructure and said compliant material.

3. The lid structure of claim 1 wherein said customized understructure comprises a material selected from the group consisting of solder, thermally conductive thermoplastic resin, and thermally conductive thermoset resin.

4. The lid structure of claim 1 wherein said lid member comprises a material selected from the group consisting of metals, metal alloys, ceramics, and composites.

5. The lid structure of claim 3 wherein said customized understructure comprises a solder.

6. An electronic module housing one or more integrated circuit chips, said module comprising:
   (a) a substrate,
   (b) at least one integrated circuit chip mounted on said substrate,
   (c) a lid comprising a lid member sealed to said substrate, said lid and said substrate defining a space for containing said integrated circuit chip(s), and
   (d) a primary heat dissipation path from said chip(s) contained in said space to said lid member, said heat dissipation path comprising:
      (i) a solid customized understructure extending from said lid member toward said chip contained in said module, and
      (ii) a thermally conductive, compliant material between said customized understructure and said chip.

7. The module of claim 6 wherein said heat dissipation path further comprises a rigid thermally conductive spacer between said solid customized understructure and said compliant material.

8. The module of claim 6 wherein said customized understructure comprises a material selected from the group consisting of solder, thermally conductive thermoplastic resin, and thermally conductive thermoset resin.

9. The module of claim 6 wherein said lid member comprises a material selected from the group consisting of metals, metal alloys, ceramics, and composites.

10. The module of claim 6 wherein said customized understructure comprises a solder.

11. The module of claim 6 comprising a plurality of said integrated chips located in said space, said primary heat dissipation path being from at least one of said chips.

12. The module of claim 11 comprising a plurality of primary heat dissipation paths such that said primary heat dissipation path exists for each of said plurality of integrated circuit chips.

13. The module of claim 6 wherein said module further comprises a plurality of electrical contact elements located between said chip and said substrate wherein said chip is mounted on said substrate through said contact elements.

14. The module of claim 13 wherein said contact elements comprise solder.

15. The module of claim 6 wherein said thermally conductive, compliant material has a thickness along said path of about 12 mils or less.

16. The module of claim 15 wherein said thermally conductive, compliant material has a thickness along said path of about 4 mils to 6 mils.

\* \* \* \* \*